(12) United States Patent
Nakada et al.

(10) Patent No.: US 8,398,771 B2
(45) Date of Patent: Mar. 19, 2013

(54) SUBSTRATE PROCESSING APPARATUS

(75) Inventors: Takayuki Nakada, Toyama (JP); Koichi Sada, Toyama (JP); Tomoyuki Matsuda, Toyama (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 633 days.

(21) Appl. No.: 12/498,639

(22) Filed: Jul. 7, 2009

(65) Prior Publication Data

US 2010/0024728 A1  Feb. 4, 2010

(30) Foreign Application Priority Data

Jul. 29, 2008  (JP) ................................. 2008-194743

(51) Int. Cl.
*C23C 16/455* (2006.01)
*C23F 1/00* (2006.01)
*H01L 21/306* (2006.01)
*C23C 16/06* (2006.01)
*C23C 16/22* (2006.01)

(52) U.S. Cl. ............... 118/724; 156/345.33; 156/345.37

(58) Field of Classification Search .................. 118/724; 156/345.33, 345.37
See application file for complete search history.

(56) References Cited

U.S. PATENT DOCUMENTS

| 2,845,907 | A | * | 8/1958 | Payne et al. | 122/275 |
| 4,455,970 | A | * | 6/1984 | Lyman | 126/362.1 |
| 6,136,725 | A | * | 10/2000 | Loan et al. | 438/758 |
| 6,296,711 | B1 | * | 10/2001 | Loan et al. | 118/726 |
| 6,659,661 | B2 | * | 12/2003 | Deguchi et al. | 396/611 |
| 6,663,716 | B2 | * | 12/2003 | Loan et al. | 118/726 |
| 6,863,019 | B2 | * | 3/2005 | Shamouilian et al. | 118/723 R |
| 7,531,061 | B2 | * | 5/2009 | Long | 156/345.27 |
| 7,935,915 | B2 | * | 5/2011 | Regan | 219/643 |
| 2001/0007174 | A1 | * | 7/2001 | Hashizume et al. | 34/92 |
| 2001/0016364 | A1 | * | 8/2001 | Loan et al. | 438/14 |
| 2001/0020786 | A1 | * | 9/2001 | Takamatsu et al. | 285/123.1 |
| 2001/0049080 | A1 | | 12/2001 | Asano et al. | |
| 2002/0076492 | A1 | * | 6/2002 | Loan et al. | 427/255.28 |
| 2002/0114632 | A1 | * | 8/2002 | Deguchi et al. | 396/611 |
| 2004/0013808 | A1 | * | 1/2004 | Hanson et al. | 427/372.2 |
| 2005/0028736 | A1 | * | 2/2005 | Long | 118/715 |
| 2010/0006256 | A1 | * | 1/2010 | Kuwano et al. | 165/47 |
| 2010/0024728 | A1 | * | 2/2010 | Nakada et al. | 118/722 |
| 2010/0227478 | A1 | * | 9/2010 | Harada | 438/735 |

FOREIGN PATENT DOCUMENTS

| EP | 1160838 | | 12/2007 |
| JP | 59198717 A | * | 11/1984 |
| KR | 20070074539 | | 7/2007 |

* cited by examiner

*Primary Examiner* — Rudy Zervigon
(74) *Attorney, Agent, or Firm* — Brundidge & Stanger, P.C.

(57) ABSTRACT

A substrate processing apparatus in accordance with the present invention includes a process chamber configured to accommodate a substrate, a gas supply line configured to supply a gas to an inside of the process chamber, and an exhaust line configured to exhaust the inside of the process chamber. The gas supply line of the substrate processing apparatus includes a preheating unit preheating the gas supplied from a gas source, a metal pipeline having an angled section wherein the metal pipe line connects the preheating unit and the inside of the process chamber to supply the gas preheated by the preheating unit into the process chamber, and a heat dissipation member covering the angled section to dissipate heat from the angled section.

6 Claims, 6 Drawing Sheets

SUBSTRATE PROCESSING APPARATUS

CROSS-REFERENCE TO RELATED PATENT APPLICATION

This U.S. non-provisional patent application claims priority under 35 U.S.C. §119 of Japanese Patent Application No. 2008-194743, filed on Jul. 29, 2008, in the Japanese Patent Office, the entire contents of which are hereby incorporated by reference.

BACKGROUND OF THE INVENTION

1. Field of the Invention

The present invention relates to a substrate processing apparatus for processing a substrate.

2. Description of the Prior Art

Conventionally, a substrate processing apparatus includes a process chamber that receives a substrate, a gas supply line that supplies gas into the process chamber, and an exhaust line that exhausts gas from the process chamber. The substrate is loaded into the process chamber, and the gas is supplied into the process chamber and exhausted from the process chamber. In this way, the substrate is processed while supplying the gas to the substrate. For several kinds of gas, gas may be preheated prior to its supply into the process chamber in order to increase a gas reaction speed (for example, see Patent Document 1).

[Patent Document] Patent Publication No. H5-295549

However, if the gas supplied into the process chamber is preheated by a preheating unit, metal contamination may occur in the substrate or the process chamber.

SUMMARY OF THE INVENTION

An object of the present invention is to provide a substrate processing apparatus which is capable of suppressing the occurrence of metal contamination in a substrate or a process chamber when gas supplied into the process chamber is preheated by a preheating unit.

According to an aspect of the present invention, there is provided a substrate processing apparatus, including: a process chamber configured to accommodate a substrate; a gas supply line configured to supply a gas to an inside of the process chamber; and an exhaust line configured to exhaust the inside of the process chamber, wherein the gas supply line includes: a preheating unit preheating the gas supplied from a gas source; a metal pipeline having an angled section, the metal pipe line connecting the preheating unit and the inside of the process chamber to supply the gas preheated by the preheating unit into the process chamber; and a heat dissipation member covering the angled section to dissipate heat from the angled section, the heat dissipation member including a pair of metal members facing each other to cover an outer surface of the angled section and a clamping means to fasten the pair of metal members to each other.

DETAILED DESCRIPTION OF THE PREFERRED EMBODIMENTS

The inventors have made intensive studies on the cause of the above-described metal contamination. As a result, the inventors found out that temperature rose locally in a bent section of a metal pipeline configured to supply preheated gas into a process chamber, and such a temperature rise was one cause of metal contamination.

That is, the inventors found out that, if the bent section existed in the metal pipeline, heated gas collided against a metal pipeline inner wall constituting the bent section, temperature of the bent section rose locally, metal component was desorbed from the metal pipeline, the desorbed metal component flowed into the process chamber together with the gas, and thus, metal contamination occurred in the substrate or the process chamber. Hence, the inventors obtained the knowledge that the local temperature rise of the bent section could be suppressed and the occurrence of metal contamination could be suppressed by installing a heat dissipation member to cover an outer periphery of the bent section formed in the metal pipeline. The present invention was invented based on this knowledge.

Hereinafter, explanation will be given on one embodiment of the present invention with reference to drawings.

Figure 2:
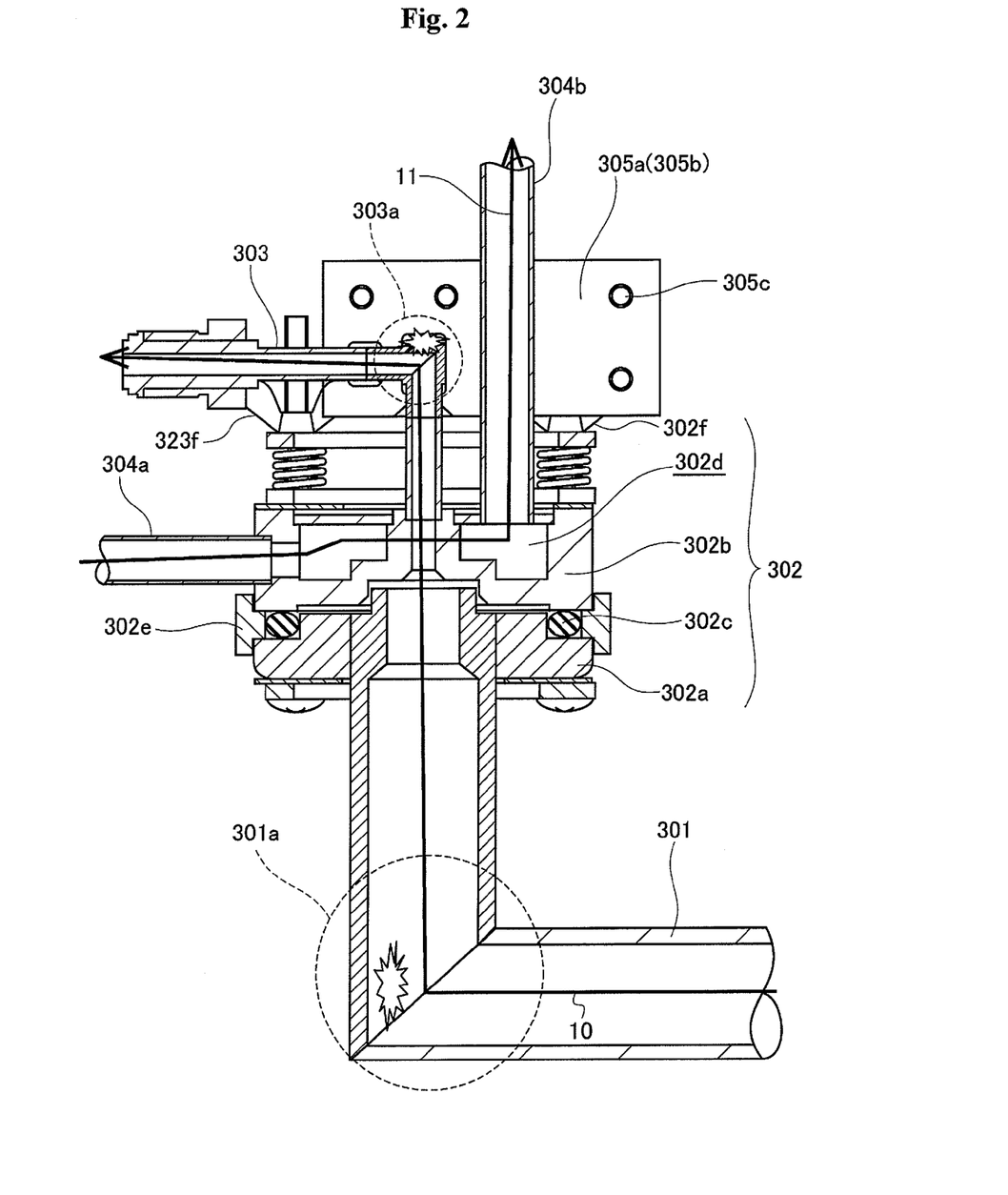
FIG. 2 is a sectional view illustrating a structure of a gas supply line in a substrate processing apparatus relevant to one embodiment of the present invention.
Figure 4:
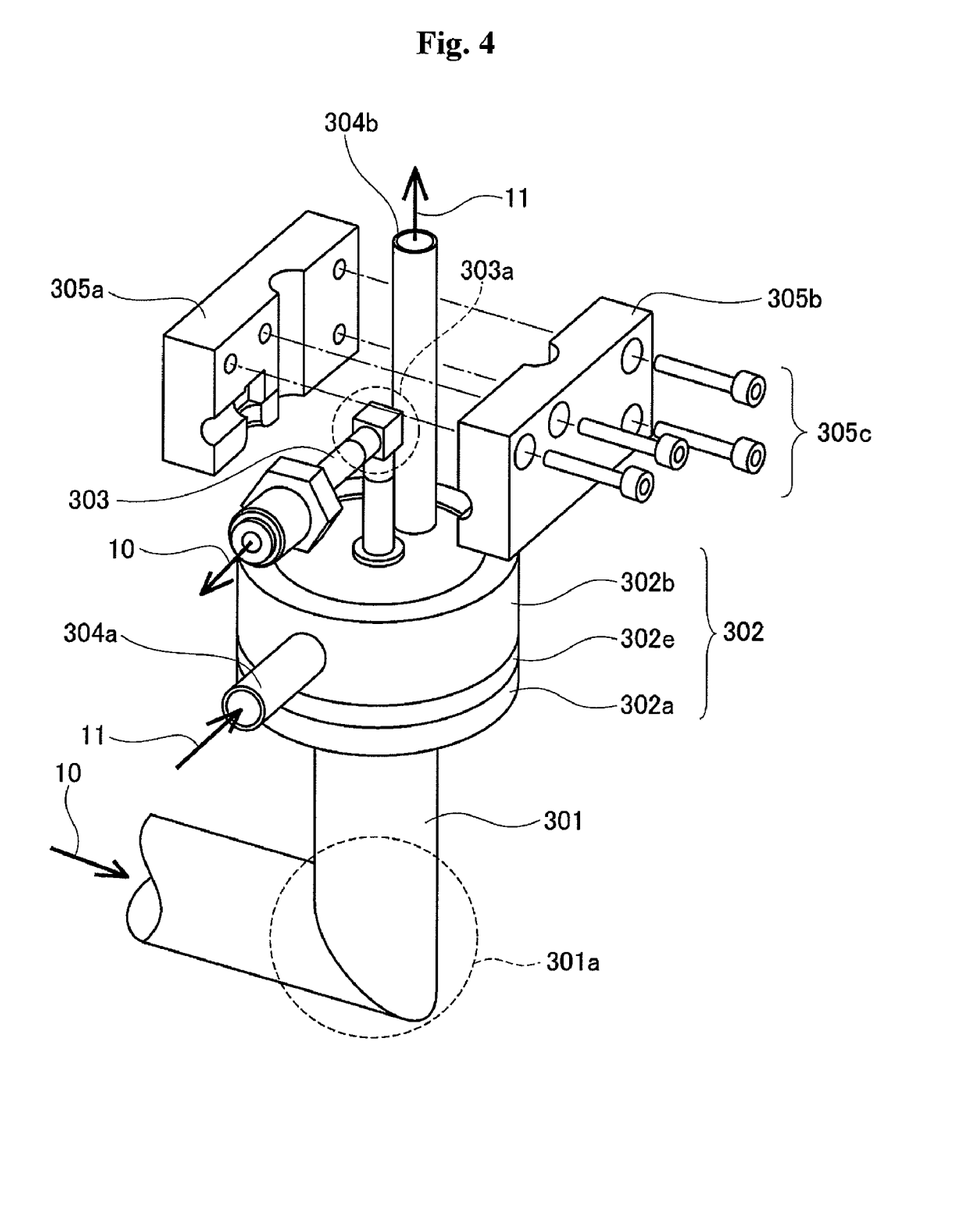
FIG. 4 is a perspective view illustrating a gas supply line in a substrate processing apparatus relevant to one embodiment of the present invention.
Figure 5:
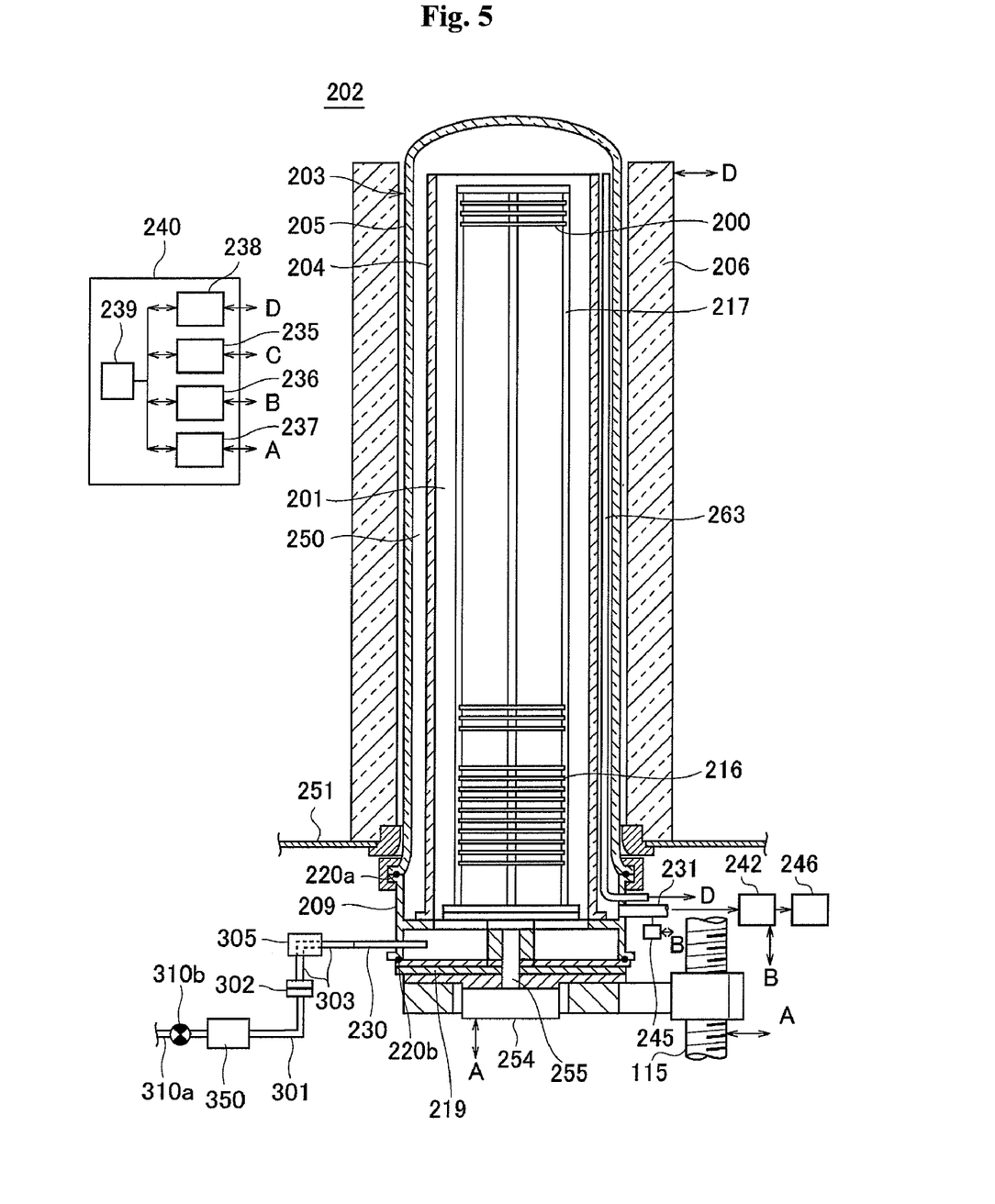
FIG. 5 is a sectional view illustrating a process furnace in a substrate processing apparatus relevant to one embodiment of the present invention.
Figure 6:
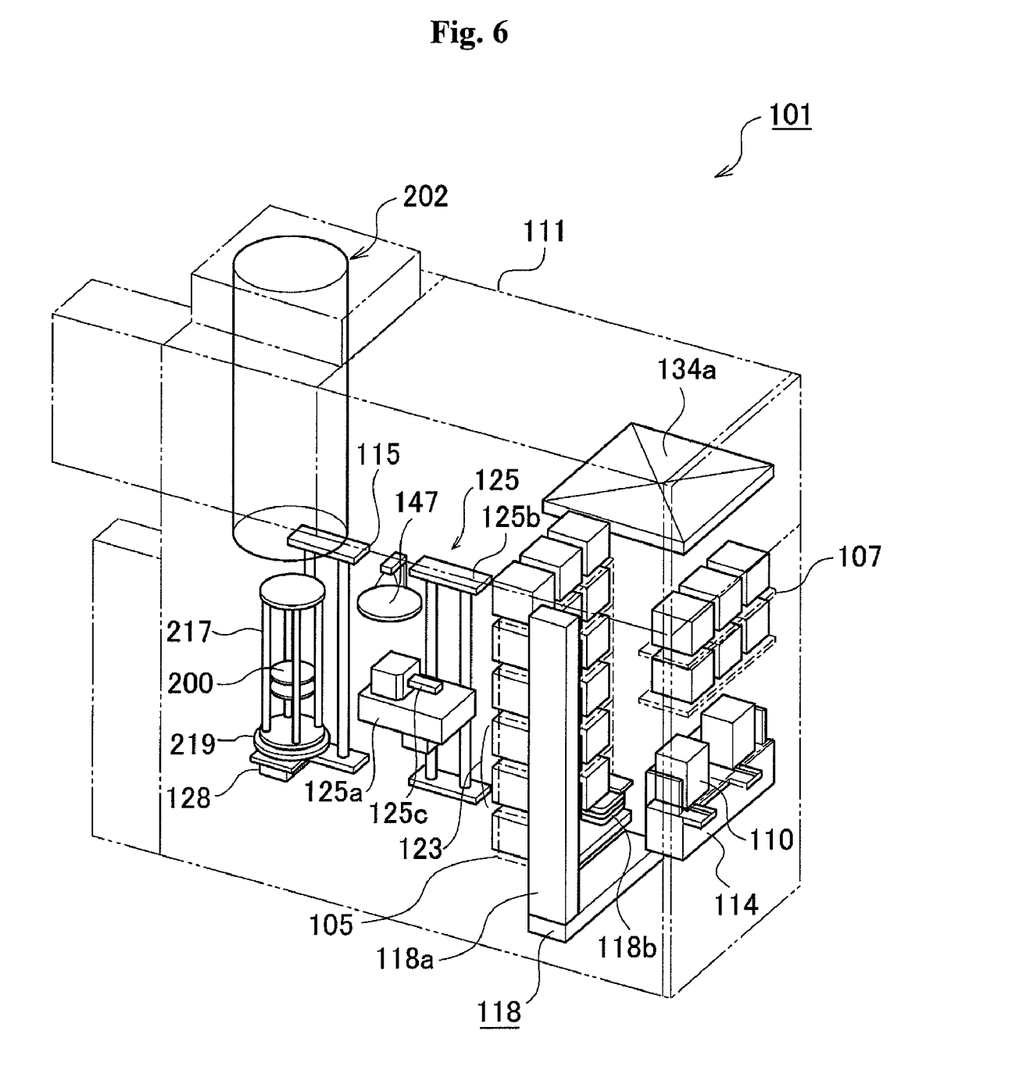
FIG. 6 is a schematic view illustrating a structure of a substrate processing apparatus relevant to one embodiment of the present invention.

FIG. 2 is a sectional view illustrating a structure of a gas supply line in a substrate processing apparatus relevant to one embodiment of the present invention. FIG. 4 is a perspective view illustrating a gas supply line in a substrate processing apparatus relevant to one embodiment of the present invention. FIG. 5 is a sectional view illustrating a process furnace in a substrate processing apparatus relevant to one embodiment of the present invention. FIG. 6 is a schematic view illustrating a structure of a substrate processing apparatus relevant to one embodiment of the present invention.

(1) Structure of Substrate Processing Apparatus

First, an exemplary structure of a substrate processing apparatus 101 relevant to one embodiment of the present invention will be described with reference to FIG. 6. The substrate processing apparatus 101 relevant to the current embodiment is configured as, for example, a vertical type nitriding treatment apparatus.

As shown in FIG. 6, the substrate processing apparatus 101 relevant to the current embodiment includes a housing 111. To carry in and carry out wafers (substrate) 200 made of silicon, a cassette 110 is used as a wafer carrier (substrate container) accommodating a plurality of wafers 200. At the inner forward side o the housing 111 (the right side of FIG. 6), a cassette stage (substrate container table) 114 is installed. The cassette 110 is designed to be carried in on the cassette stage 114, and to be carried from the cassette stage 114 out of the housing 111, by an in-plant carrying device (not shown).

By the in-plant carrying device, the cassette 110 is installed on the cassette stage 114 so that the wafers 200 maintain a vertical position inside the cassette 110, and a wafer carrying-in and carrying-out opening of the cassette 110 faces an upward direction. The cassette stage 114 is configured so that the cassette 110 is rotated 90 degrees in a longitudinal direction to face the backward of the housing 111, and the wafers 200 inside the cassette 110 take a horizontal position, and the wafer carrying-in and carrying-out opening of the cassette 110 faces the backward of the housing 111.

Near to the center part inside the housing 111 in a front and back direction, a cassette shelf (substrate container placement shelf) 105 is installed to store a plurality of cassettes 110 in a plurality of stages and a plurality of rows. At the cassette shelf 105, a transfer shelf 123 is installed to store the cassettes 110 which are carrying objects of a wafer transfer mechanism 125 to be described later. At the upward of the cassette stage 114, a standby cassette shelf 107 is installed to store a standby cassette 110.

Between the cassette stage 114 and the cassette shelf 105, a cassette carrying device (substrate container carrying device) 118 is installed. The cassette carrying device 118 includes a cassette elevator (substrate container elevating mechanism) 118a, which is capable of holding and moving the cassette 110 upward and downward, and a cassette carrying mechanism (substrate container carrying mechanism) 118b as a carrying mechanism, which is capable of holding and moving the cassette 110 horizontally. The cassette carrying device 118 is designed to carry the cassette 110 among the cassette stage 114, the cassette shelf 105, the standby cassette shelf 107, and the transfer shelf 123 by continuous motions of the cassette elevator 118a and the cassette transfer mechanism 118b.

At the backward of the cassette shelf 105, a wafer transfer mechanism (substrate transfer mechanism) 125 is installed. The wafer transfer mechanism 125 includes a wafer transfer device (substrate transfer device) 125a, which is capable of horizontally rotating or straightly moving the wafer 200, and a wafer transfer device elevator (substrate transfer device elevating mechanism) 125b configured to move the wafer transfer device 125a upward and downward. The wafer transfer device 125a includes tweezers (jig for substrate transfer) 125c for holding the wafer 200 at a horizontal position. By the continuous operation of the wafer transfer device 125a and the wafer transfer device elevator 125b, the wafer transfer mechanism 125 is configured to pick up the wafer 200 into the cassette 110 on the transfer shelf 123 and charge the wafer 200 into a boat (substrate holding member) 217 to be described later, or to discharge the wafer 200 from the boat 217 and accommodate the wafer 200 in the cassette 110 on the transfer shelf 123.

At the upward of the rear part of the housing 111, a process furnace 202 is installed, and the lower end part of the process furnace 202 is configured to be opened and closed by a furnace throat shutter (furnace throat opening/closing mechanism) 147. The structure of the process furnace 202 will be described later.

At the downward of the process furnace 202, a boat elevator (substrate support member elevating mechanism) 115 is installed as an elevating mechanism to carry the boat 217 inside or outside the process furnace 202. As a connector, an arm 128 is installed at the elevating table of the boat elevator 115. On the arm 128, a seal cap 219 is configured to vertically support the boat 217, and horizontally installed as a lid to air-tightly close the lower part of the process furnace 202 when the boat 217 is moved upward by the boat elevator 115.

The boat 217 is installed with a plurality of holding members, and is configured to horizontally hold a plurality of sheets (for example, from about 50 to 150 sheets) of wafers 200 in a state of being vertically arranged, with their centers aligned. A detailed structure of the boat 217 will be described later.

At the upward of the cassette shelf 105, a clean unit 134a configured by a supply fan and a dust-proof filter is installed. The clean unit 134a is configured to circulate purified clean air through the inside of the housing 111.

Also, at the left end part of the housing 111, which is an opposite part to the wafer transfer device elevator 125b and the boat elevator 115, a clean unit (not shown) is installed to supply clean air. The clean air unit is also configured by a supply fan and a dust-proof filter. The clean air blown from the clean unit (not shown) flows through the surrounding area of the wafer transfer device 125a and the boat 217, and then is exhausted to the outside of the housing 111 by an exhaust device (not shown).

(2) Operation of Substrate Processing Apparatus

Next, explanation will be given on the operation of the substrate processing apparatus 101 relevant to the current embodiment.

First, the cassette 110 is placed on the cassette stage 114 by the in-plant carrying device (not shown) such that the wafer 200 is held at a vertical position and the wafer carrying-in and carrying-out opening of the cassette 110 faces an upward direction. Thereafter, by the cassette stage 114, the cassette 110 is rotated 90 degrees in a longitudinal direction to face the backward of the housing 111. As a result, the wafer 200 inside the cassette 110 takes a horizontal position, and the wafer carrying-in and carrying-out opening of the cassette 110 faces the backward of the housing 111.

Then, the cassette 110 is automatically carried and temporarily stored in a specific shelf position of the cassette shelf 105 or the standby cassette shelf 107 by the cassette carrying device 118, and transferred from the cassette shelf 105 or the standby cassette shelf 107 to the transfer shelf 123 by the cassette carrying unit 118, or directly transferred to the transfer shelf 123.

When the cassette 110 is delivered to the transfer shelf 123, the wafer 200 is picked up from the cassette 110 through the wafer carrying-in and carrying-out opening by the tweezers 125c of the wafer transfer device 125a, and is charged into the boat 217 disposed at the backward of the transfer chamber 124 by the continuous operation of the wafer transfer device 125a and the wafer transfer device elevator 125b. The wafer transfer mechanism 125, which delivers the wafer 200 to the boat 217, returns to the cassette 110 and charges the next wafer 200 into the boat 217.

When predetermined sheets of the wafers 200 are charged into the boat 217, the lower end part of the process furnace 202, which was kept closed by the furnace throat shutter 147, is opened by the furnace throat shutter 147. Subsequently, the seal cap 219 is moved upward by the boat elevator 115, and the boat 217 holding a group of wafers 200 is loaded into the process furnace 202. After the loading, an optional processing is applied to the wafers 200 in the process furnace 202. After the processing, the wafers 200 and the cassette 110 are unloaded from the housing 111 in a reverse sequence of the above.

(3) Structure of Process Furnace

A structure of the process furnace 202 relevant to the current embodiment will be described below with reference to FIG. 2, FIG. 4 and FIG. 5. FIG. 5 is a vertical sectional view illustrating the process furnace 202 of the substrate processing apparatus relevant to one embodiment of the present invention.

(Process Chamber)

As illustrated in FIG. 5, the process chamber 202 includes a process tube as a reaction tube. The process tube 203 includes an inner tube 204 as an inner reaction tube, and an outer tube 205 as an outer reaction tube installed outside the inner tube 204. The inner tube 204 is made of a heat-resistant material, for example, quartz ($SiO_2$) or silicon carbide (SiC), and is formed in a cylindrical shape with an upper part and a lower part opened. At the cylindrical hollow part of the inner tube 204, a process chamber 201 where wafers 200 such as substrates are processed is formed. The inside of the process chamber 201 is configured to receive the boat 217 which will be described later. The outer tube 205 is installed concentrically with the inner tube 204. An inner diameter of the outer tube 205 is greater than an outer diameter of the inner tube 204, and the outer tube 205 is formed in a cylindrical shape with an upper part closed and a lower part opened. The outer tube 205 is made of a heat-resistant material, for example, quartz or silicon carbide.

At the downward of the outer tube 205, a manifold 209 is installed concentrically with the outer tube 205. The manifold 209 is made of stainless steel or the like and is formed in a cylindrical shape with an upper part and a lower part opened. The manifold 209 connects and supports the lower end part of the inner tube 204 and the lower end part of the outer tube 205. Between the manifold 209 and the outer tube 205, an O-ring 220a is installed as a sealing member. Since the manifold 209 is supported on a heat base 251, the process tube 203 is kept in a vertically fixed state. A reaction vessel is formed by the process tube 203 and the manifold 209.

(Gas Supply Line)

As illustrated in FIG. 2, at the manifold 209, a nozzle 230 as a gas inlet port is connected vertically to communicate with the inside of the process chamber 201. At the upstream end of the nozzle 230, the downstream end of a metal pipeline 303 made of a metal is connected. The upstream end of the metal pipeline 303 is connected to the downstream end of a quartz pipeline 301 via a joint 302. The upstream end of the quartz pipeline 301 is connected to a preheating unit 350. The preheating unit 350 is configured to supply gas such as $N_2O$ gas from a gas supply source (not shown) through a gas supply pipe 310a. At the gas supply pipe 310a, an open-close valve 310b is installed.

When the open-close valve 310b is opened, gas is supplied from the gas supply source (not shown) into the preheating unit 350, and is heated by the preheating unit 350. The high-temperature gas heated by the preheating unit 350 is supplied into the process chamber 201 through the quartz pipeline 301, the metal pipeline 303, and the nozzle 230. Mainly, a gas supply line for supplying gas into the process chamber 201 is configured by the nozzle 230, the metal pipeline 303, the joint 302, the quartz pipeline 301, the preheating unit 350, and the gas supply source (not shown).

As illustrated in FIG. 2 and FIG. 4, a bent section 303a is formed at the metal pipeline 303. Also, at the metal pipeline 303, a heat dissipation member 305 is installed to cover the outer periphery of the bent section 303a.

The heat dissipation member 305 includes a pair of metal members 305a and 305b configured so that the outer periphery of the bent section 303a formed in the metal pipeline 303 is intervened between them, and a clamp 305c configured to fix the metal member 305a and the metal member 305b The facing surfaces of the pair of the metal members 305a and 305b are recessed in the same shape as the outline of the bent section 303a in order to improve the heat dissipation efficiency of the bent section 303a due to heat transfer by increasing a contact area between the outer periphery of the bent section 303a and the metal members 305a and 305b. Also, it is preferable that the pair of the metal members 305a and 305b is made of a metal having high heat dissipation characteristic due to a heat transfer rate or radiation, and, for example, a metal such as aluminum or copper may be used.

Moreover, at the pair of the metal members 305a and 305b, a groove structure (heat sink structure) for increasing a surface area may be formed. The bent section 303a is not limited to the current embodiment in which the bent section 303a is bent at 90° (the bent section 303a is formed in an elbow shape), and, for example, may be bent at 40° or 60°.

As illustrated in FIG. 2, the joint 302 includes a first flange 302a installed in the downstream end of the quartz pipeline 301, and a second flange 302b installed in the upstream end of the metal pipeline 303. Since the first flange 302a and the second flange 302b are joined to face each other through the O-ring 302c as the sealing member by the clamp 302f, the downstream of the quartz pipeline 301 and the upstream of the metal pipeline 303 are air-tightly connected. Also, between the first flange 302a and the second flange 302b, a Teflon ring 302e is installed to surround the outer periphery of the O-ring 302c. An inner diameter of the O-ring 302c as the sealing member is greater than an inner diameter of the quartz pipeline 301 and an inner diameter of the metal pipeline 303 so that the high-temperature gas flow 10 flowing from the quartz pipeline 301 to the metal pipeline 303 does not directly contact the O-ring 302c.

As illustrated in FIG. 2, at the inside of the second flange 302b, a cooling medium flow channel 302d is formed to circulate cooling liquid or cooling gas. The second flange 302b is connected to a cooling medium supply pipe 304a, which is configured to supply cooling liquid or cooling gas as a cooling medium into the cooling medium flow channel 302d, and a cooling medium exhaust pipe 304b, which is configured to exhaust the cooling liquid or the cooling gas from the inside of the cooling medium flow channel 302d. The cooling medium exhaust pipe 304b contacts the heat dissipation member 305 so that heat transfer to the heat dissipation member 305 is possible. Specifically, the cooling medium exhaust pipe 304b is intervened between the pair of the metal members 305a and 305b, together with the metal pipeline 303. The facing surfaces of the pair of the metal members 305a and 305b are recessed in the same shape as the outline of the cooling medium exhaust pipe 304b in order to improve the heat dissipation efficiency of the metal members 305a and 305b due to heat transfer by increasing a contact area between the cooling medium exhaust pipe 304b and the metal members 305a and 305b. Also, instead of the cooling medium exhaust pipe 304b, the cooling medium supply pipe 304a may be intervened between the pair of the metal members 305a and 305b.

Figure 3:
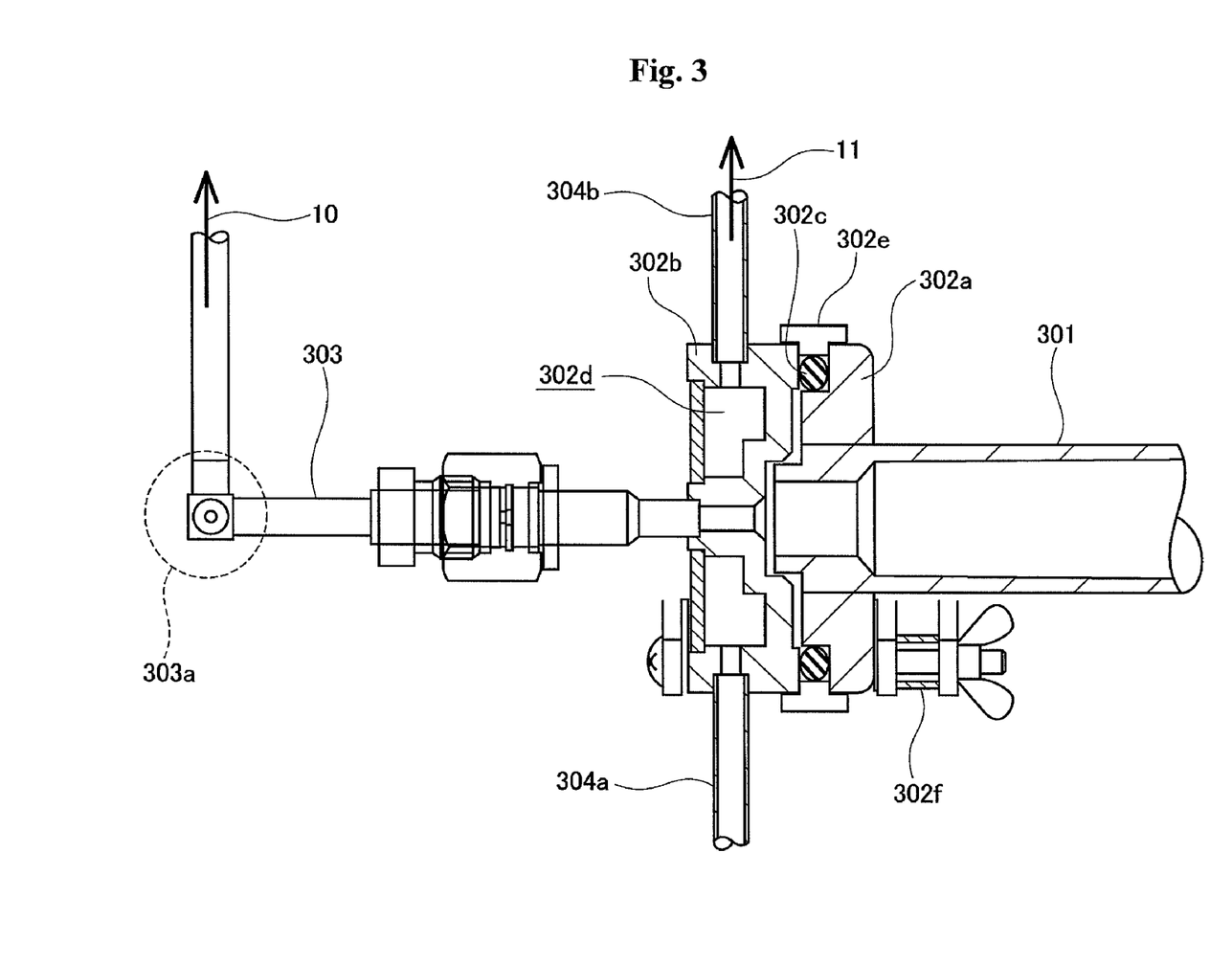
FIG. 3 is a sectional view illustrating a structure of a gas supply line in a substrate processing apparatus relevant to another embodiment of the present invention.

As illustrated in FIG. 2, near to the downstream end of the quartz pipeline 301 (upstream side of the quartz pipeline 301 near to the joint 302), a bent section 301a is installed so as to accelerate collision of heated gas against the quartz pipeline 301 (heat dissipation by collision). However, the quartz pipeline 301 relevant to the present invention is not limited to the above-described shape, and the bent section 301a may not be installed as illustrated in FIG. 3.

(Exhaust Line)

At the manifold 209, an exhaust pipe 231 is installed to exhaust atmosphere inside the process chamber 201. The exhaust pipe 231 communicates with a lower end of a cylindrical space 250 formed by a gap between the inner tube 204 and the outer tube 205. At the downstream side of the exhaust pipe 231 (opposite to the contact side with the manifold 209), a pressure sensor 245 as a pressure detector, an Auto Pressure Controller (APC) valve 242 as a pressure controller, and a vacuum pump 246 as a vacuum exhaust device are connected sequentially from the upstream side. Mainly, an exhaust line configured to exhaust the inside of the process chamber 201 is configured by the exhaust pipe 231, the pressure sensor 245, the APC valve 242, and the vacuum pump 246. At the APC valve 242 and the pressure sensor 245, a pressure control unit 236 is electrically connected. The pressure control unit 236 is configured to control the APC valve 242 so that pressure inside the process chamber 201 is made to have a desired level at a desired timing, based on a pressure value detected by the pressure sensor 245.

(Seal Cap)

At the lower part of the manifold 209, a seal cap 219 is installed as a furnace throat cap body that can air-tightly close the lower opening of the manifold 209. The seal cap 219 contacts the lower end of the manifold 209 from a vertical-direction lower side. The seal cap 219 is made of stainless steel or the like and is formed in a disk shape. At the surface of the seal cap 219, an O-ring 220b is installed as a sealing member which contacts the lower end of the manifold 209. At the opposite side to the process chamber 201 which is near to the center part of the seal cap 219, a rotating mechanism 254 is installed to rotate a boat. A rotation shaft 255 of the rotating mechanism 254 passes through the seal cap 219 and supports the boat 217 from the downward.

The rotating mechanism 254 is configured to rotate the boat 217 so that the wafer 200 is rotatable. The seal cap 219 is configured to move upward and downward by a boat elevator 115 as an elevating mechanism installed vertically in the outside of the process tube 203. The boat elevator 115 is configured to move the seal cap 219 upward so that the boat 217 is carried in and out of the process chamber 201. At the rotating mechanism 254 and the boat elevator 115, a driving control unit 237 is electrically connected. The driving control unit 237 is configured to control the rotating mechanism 254 and the boat elevator 115 so that they are operated at a desired timing.

(Boat)

As described above, the boat 217 as a substrate holder is configured to hold a plurality wafers 200 at a horizontal position in multiple stages, with their centers aligned. The boat 217 is made of a heat-resistant material, for example, quartz or silicon carbide. At the lower part of the boat 217, a plurality of heat insulation plates 216 as disk-shaped heat insulation members made of a heat-resistant material such as quartz or silicon carbide are arranged at a horizontal position in multiple stages and are configured to make it difficult to transfer heat from the heater 206 toward the manifold 209.

(Heating Unit)

At the outside of the process tube 203, the heater 206 is installed as a heating unit to surround the sidewall surface of the process tube 203. The heater 206 has a cylindrical shape and is installed vertically so that it is supported by a heater base 251 as a holding plate.

At the inside of the process tube 203, a temperature sensor 263 is installed as a temperature detector. A temperature control unit 238 is electrically connected to the heater 206 and the temperature sensor 263. The temperature control unit 238 is configured to control an electrified state of the heater 206, based on temperature information detected by the temperature sensor 263, so that temperature inside the process chamber 201 is made to have a desired temperature distribution at a desired timing.

(Controller)

A gas flow rate control unit 235, a pressure control unit 236, a driving control unit 237, and a temperature control unit 238 are electrically connected to a main control unit 239 which controls an overall operation of the substrate processing apparatus 100 (hereinafter, the gas flow rate control unit 235, the pressure control unit 236, the driving control unit 237, and the temperature control unit 238 will be referred to as an I/O control unit). The gas flow rate control unit 235, the pressure control unit 236, the driving control unit 237, the temperature control unit 238, and the main control unit 239 constitute a controller 240 as a control unit.

(4) Operation of Process Furnace

Next, explanation will be given on a method for forming a nitride film such as a silicon nitride film, which is one of semiconductor device manufacturing processes, wherein the nitride film such as a silicon nitride film is formed by supplying NO gas onto a wafer 200 made of silicon or the like by using the process furnace 202 having the above-described structure. In the following description, the operations of the respective parts constituting the substrate processing apparatus 101 are controlled by the controller 240.

(Substrate Loading Process (S1))

First, a plurality of wafers 200 to be processed are charged into the boat 217. The seal cap 219 is moved downward by the boat elevator 115 and thus the lower end of the manifold 209 is opened. Hence, the boat 217 supporting the plurality of wafers 200 is moved upward by the boat elevator 115 and is loaded into the process chamber 201. The lower opening (furnace throat) of the manifold 209 is sealed via the O-ring 220b by the seal cap 219. The resulting state is illustrated in FIG. 2.

(Depressurization Process and Temperature Rising Process (S2))

Subsequently, the vacuum pump 246 operates to open the APC valve 242 and evacuate the inside of the process chamber 201 through the exhaust pipe 231. In this case, the opening degree of the APC valve 242 is feedback controlled, based on the measured value of the pressure sensor 245, so that the inside of the process chamber 201 is made to have a desired pressure (vacuum degree). Also, the heater 206 is electrified to heat the inside of the process chamber 201. At this point, the electrified amount of the heater 206 is controlled, based on the measured value of the temperature sensor 263, so that the surface of the wafer 200 is made to have a desired temperature. The rotating mechanism 254 operates to rotate the wafer 200 together with the boat 217.

(Gas Supply Process (S3))

Subsequently, the open-close valve 310b is opened to supply $N_2O$ gas from the gas supply source (not shown) to the preheating unit 350, and the $N_2O$ gas is heated and decomposed by the preheating unit 350 to generate NO gas. Hence, the generated high-temperature NO gas (or mixed gas of $N_2O$ gas and NO gas) is supplied from the preheating unit 350 to the inside of the process chamber 201 via the quartz pipeline 301, the metal pipeline 303, and the nozzle 230. When the generated NO gas is supplied into the process chamber 201, the generated NO gas is not returned to $N_2O$ gas and is in a stable state as it is, even though temperature is lowered. It is preferable that the temperature of the $N_2O$ gas heated by the preheating unit 350 is a temperature at which the $N_2O$ gas is decomposed most efficiently, and the related temperature can be obtained experimentally.

The NO gas supplied into the process chamber 201 moves upward at the inside of the process chamber 201, circulates from the upper opening of the inner tube 204 toward the cylindrical space 250, and is exhausted from the gas exhaust line. At this point, the NO gas is supplied to the surface of each wafer 200, and a silicon nitride film (SiN film) is formed on the surface of each wafer 200.

In the gas supply process (S3), cooling liquid or cooling gas as a cooling medium is supplied into the cooling medium flow channel 302d formed inside the second flange 302d.

(Pressure Rising Process (S5))

When the silicon nitride film is formed on the wafer 200 to a desired thickness by continuously supplying the NO gas into the process chamber 201 for a certain time, the open-close valve 310b is closed to stop the supply of the NO gas into the process chamber 201, and gas remaining in the process chamber 201 is exhausted. At this time, by supplying inert gas such as $N_2$ gas into the process chamber 201 through an inert gas supply line (not shown), the exhaust of the NO gas from the inside of the process chamber 201 can be accelerated. Thereafter, by adjusting the opening degree of the APC valve 242 while continuously supplying the inert gas into the process chamber 201, pressure inside the process chamber 201 rises up to atmospheric pressure.

(Substrate Discharging Process (S6))

Subsequently, by moving the seal cap 219 downward by the boat elevator 115, the lower end of the manifold 209 is opened and simultaneously the boat 217 holding the processed wafer 200 is moved downward, so that the boat is unloaded from the process chamber 201 (boat unloading). In this way, the processed wafer 200 is discharged from the unloaded boat 217, and the substrate processing process relevant to the current embodiment is finished.

(5) Effect Relevant to the Current Embodiment

The current embodiment obtains one or more of the following effects (a)~(h).

(a) In accordance with the current embodiment, at the outer periphery of the bent section 303a formed in the metal pipeline 303, the pair of the metal members 305a and 305b are installed so that the bent section 303a is intervened between them. As a result, the local temperature rise of the bent section 303a is suppressed by heat transfer from the bent section 303a to the heat dissipation member 305. That is, in the gas supply process (S3), the high-temperature NO gas flowing from the quartz pipeline 301 to the inside of the metal pipeline 303 collides against the inner wall of the metal pipeline 303 constituting the bent section 303a, and thus, the temperature of the bent section 303a will rise locally. However, by the heat transfer from the bent section 303a to the heat dissipation member 305, metal component is dispatched from the metal pipeline 303, thereby suppressing the occurrence of metal contamination in the wafer 200 or the process chamber 201.

(b) In accordance with the current embodiment, by installing the pair of the metal members 305a and 305b, the local temperature rise of the bent section 303a can be suppressed, even though the flow rate of the high-temperature NO gas further increases, or the temperature of the NO gas further increases. That is, while suppressing the occurrence of the metal contamination, the substrate can be processed under more various conditions (for example, a higher flow rate, a higher temperature).

(c) In accordance with the current embodiment, the facing surfaces of the pair of the metal members 305a and 305b are recessed in the same shape as the bent section 303a. As a result, since the contact area between the outer periphery of the bent section 303a and the pair of the metal members 305a and 305b increases, the heat transfer from the bent section 303a to the heat dissipation member 305 is accelerated, thereby further suppressing the temperature rise of the bent section 303a.

(d) In accordance with the current embodiment, by making the outer periphery of the bent section 303a intervened between the pair of the metal members 305a and 305b, the mechanical strength at the position near the bent section 303a is improved. Also, since the facing surfaces of the pair of the metal members 305a and 305b are recessed in the same shape as the outline of the bent section 303a, the mechanical strength at the position near the bent section 303a is further improved.

(e) In order to suppress the occurrence of metal contamination caused by the local temperature rise of the metal pipeline 303a, the metal pipeline 303 for supplying gas into the process chamber 201 may be modified into a quartz pipeline. However, compared with the metal pipeline, the quartz pipeline is difficult to install and is also expensive. In accordance with the current embodiment, by the simple addition of the heat dissipation member 305 to the bent section 303a of the metal pipeline 303, the occurrence of metal contamination is suppressed at low cost and with ease, without changing the material of the metal pipeline 303 and also changing the installation.

(f) In accordance with the current embodiment, the inner diameter of the O-ring 302c installed between the first flange 302a and the second flange 302b is configured to be greater than the inner diameter of the quartz pipeline 301 and the inner diameter of the metal pipeline 303. As a result, the high-temperature NO gas flowing from the quartz pipeline 301 to the metal pipeline 303 does not directly contact the O-ring 302c, and thus, the temperature rise of the O-ring 302c is suppressed. As a result, the degradation of the O-ring 302c is suppressed, and the maintenance frequency of the substrate processing substrate 101 is reduced. Moreover, since the desorption of component from the O-ring 302c is suppressed, the contamination of the wafer 200 or the process chamber 201 is suppressed.

(g) In accordance with the current embodiment, the cooling medium flow channel 302d is formed inside the second flange 302b, and the cooling liquid or the cooling gas is supplied into the cooling medium flow channel 302d in the gas supply process (S3). Accordingly, the temperature rise of the O-ring 302c is suppressed, the degradation of the O-ring 302c is suppressed, and the maintenance frequency of the substrate processing apparatus 101 is reduced. Moreover, since the cooling of the individual members near the second flange 302b is accelerated, the temperature of the NO gas supplied into the metal pipeline 303 is lowered and the local temperature rise of the bent section 303a is suppressed.

(h) In accordance with the current embodiment, at the position near the downstream end of the quartz pipeline 301 (upstream side of the quartz pipeline 301 near the joint 302), the bent section 301a is installed. Since such a structure causes the high-temperature NO gas to collide against the sidewall of the quartz pipeline 301 constituting the bent section 301a, the heat dissipation from the NO gas to the quartz pipeline 301 is accelerated, and the temperature of the NO gas supplied into the metal pipeline 303 is lowered, thereby suppressing the temperature rise of the bent section 303a of the metal pipeline 303. Even though the temperature of the bent section 301a of the metal pipeline 303 becomes locally high by the collision with the NO gas, since the bent section 301a is made of quartz, metal component is not desorbed from the quartz pipeline 301 and metal contamination does not occur.

Figure 1:
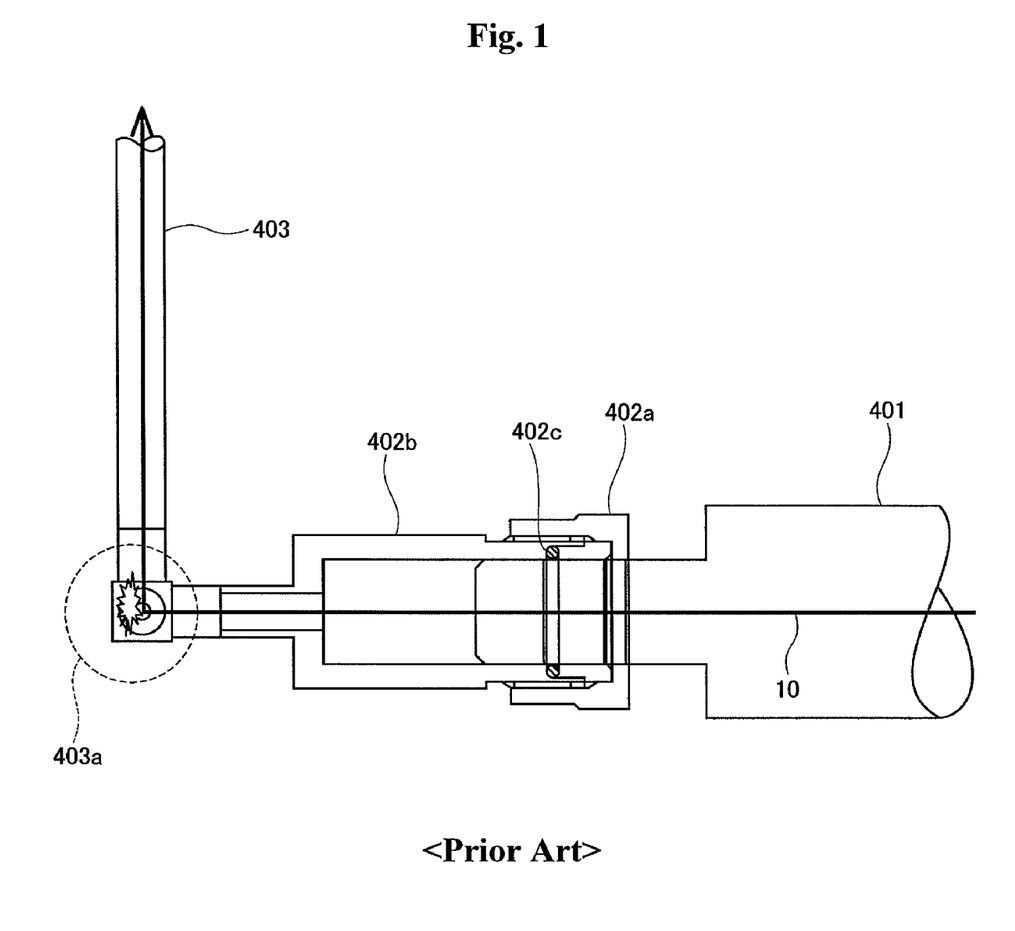
FIG. 1 is a sectional view illustrating a structure of a gas supply line in a conventional substrate processing apparatus.

The structure of the gas supply line of the conventional substrate processing apparatus is illustrated in FIG. 1.

Generally, the gas supply line of the conventional substrate processing apparatus includes a quartz pipeline 401 configured to exhaust heated gas, a metal pipeline 403 configured to supply heated gas into a process chamber, and a joint 402 configured to connect the quartz pipeline 401 to the metal pipeline 403. The joint 402 includes a first flange 402a installed in the downstream end of the quartz pipeline 401, a second flange 402b installed in the upstream end of the metal pipeline 403, and an O-ring 402c configured to air-tightly seal the gap between the first flange 402a and the second flange 402b.

In the conventional substrate processing apparatus, the heat dissipation member is not installed in the bent section 403a which is formed in the metal pipeline 403. Thus, if heated gas collides against the inner wall of the metal pipeline 403 constituting the bent section 403a, temperature of the metal pipeline 403 constituting the bent section 403a locally rises so that metal component is desorbed from the metal pipeline 403, and the desorbed metal component flows into the process chamber together with gas, which causes metal contamination in the substrate or the process chamber.

Furthermore, in the conventional substrate processing apparatus, the inner diameter of the O-ring 402c is configured to be substantially identical to the inner diameter of the quartz pipeline 401. For this reason, the high-temperature NO gas flowing from the quartz pipeline 401 to the metal pipeline 403 directly contacts the O-ring 402c, and the heat-resistant limit of the O-ring 402c has been often exceeded. Moreover, in the conventional substrate processing apparatus, the cooling medium flow channel is not formed inside the second flange 402b, and the cooling medium flows into the second flange 402b. Hence, it was difficult to suppress the temperature rise of the O-ring 402c.

EMBODIMENTS

Hereinafter, embodiments of the present invention and comparative examples will be described.

Embodiment 1

The same process as the above-described substrate processing was performed by using the above-described substrate processing apparatus in which the pair of the metal members 305a and 305b were provided and the bent section 301a was installed in the position near the downstream end of the quartz pipeline 301. When the heating temperature of the $N_2O$ gas was 1,000° C.; the flow rate of the $N_2O$ gas was 15 L/min; and the flow rate of the cooling liquid (cooling water) was 1.5 L/min, the surface temperature of the O-ring 302c was 168° C. in the gas supply process (S3), which was much lower than 327° C., that is, the heat-resistant limit of the O-ring 302c.

Embodiment 2

The same process as the above-described substrate processing was performed by using the above-described substrate processing apparatus in which the pair of the metal members 305a and 305b were provided and the bent section 301a was installed in the position near the downstream end of the quartz pipeline 301. When the heating temperature of the $N_2O$ gas was 1,000° C.; the flow rate of the $N_2O$ gas was 10 L/min; and the flow rate of the cooling liquid (cooling water) was 1.5 L/min, the surface temperature of the bent section 303a was suppressed to 155° C. in the gas supply process (S3).

Embodiment 3

The same process as the above-described substrate processing was performed by using the above-described substrate processing apparatus in which the pair of the metal members 305a and 305b were provided and the bent section 301a was not installed in the position near the downstream end of the quartz pipeline 301. When the heating temperature of the $N_2O$ gas was 1,000° C.; the flow rate of the $N_2O$ gas was 10 L/min; and the flow rate of the cooling liquid (cooling water) was 2.5 L/min, the surface temperature of the Teflon ring 302e was suppressed to 132° C. in the gas supply process (S3).

Embodiment 4

The same process as the above-described substrate processing was performed by using the above-described substrate processing apparatus in which the pair of the metal members 305a and 305b were provided and the bent section 301a was not installed in the position near the downstream end of the quartz pipeline 301. When the heating temperature of the $N_2O$ gas was 1,000° C.; the flow rate of the $N_2O$ gas was 10 L/min; and the flow rate of the cooling liquid (cooling water) was 2.5 L/min, the surface temperature of the Teflon ring 302e was suppressed to 93° C. in the gas supply process (S3). That is, by installing the bent section 301a at the position near the downstream end of the quartz pipeline 301, the temperature of gas flowing through the metal pipeline 303 was lowered, and thus, the temperature rise of the bent section 303a of the metal pipeline 303 was also suppressed.

Comparative Example 1

The substantially same process as the embodiment 1 was performed by using the conventional substrate processing apparatus in which the pair of the metal members 305a and 305b was not provided. When the heating temperature of the $N_2O$ gas was 1,000° C. and the flow rate of the $N_2O$ gas was 5 L/min, the surface temperature of the O-ring 402c was 335° C. in the gas supply process (S3) and also exceeded 327° C. which was the heat-resistant limit of the O-ring 402c.

Comparative Example 2

The substantially same process as the embodiment 2 was performed by using the conventional substrate processing apparatus in which the pair of the metal members 305a and 305b was not provided. When the heating temperature of the $N_2O$ gas was 1,000° C. and the flow rate of the $N_2O$ gas was 10 L/min, the surface temperature of the O-ring 402c was 315° C. in the gas supply process (S3).

<Another Embodiment of the Present Invention>

Although the case of generating NO gas by supplying $N_2O$ gas into the preheating unit 350 has been described as an example in the above-described embodiments, the present invention is not limited to those embodiments. That is, gases other than the $N_2O$ gas may also be supplied to the preheating unit 350 and heated.

Also, the present invention is not limited to a case of supplying one kind of gas into the process chamber 201, but may also be more suitably applied to a case of supplying various kinds of gases into the process chamber 201 simultaneously or alternately. In this case, only several kinds of gases may be heated by the preheating unit, and all kinds of gases may be heated by the preheating unit.

Furthermore, the present invention can also be applied to positions other than the bent section 303a of the metal pipeline 303. That is, the present invention can be very suitably applied to positions, except the bent section 303a, where temperature may rise locally due to collision of heated gas. For example, in case where high-temperature gas collides against constituent parts such as an open-close valve or vacuum tube installed on the passage of the gas flow 10 and temperatures of those constituent members locally rise, the local temperature rise can be suppressed by intervening those constituent parts between the pair of the metal members 305a and 305b, thereby suppressing the occurrence of metal contamination.

Although the case of providing the pair of the metal members 305a and 305b as the heat dissipation member 305 has been described in the above-described embodiments, the present invention is not limited to those embodiments. That is, the heat dissipation member 305 may be configured by one piece of a metal member, or may be configured by three or more pieces of metal members. Furthermore, the present invention is not limited to the case of configuring the heat dissipation member 305 with metal members, the heat dissipation member 305 may also be made of non-metal materials such as ceramic having heat conductivity characteristic.

Although the case where the process tube 203 as the reaction tube is configured with a double-tube having the inner tube 204 and the outer tube 205 has been described in the above-described embodiments, the present invention is not limited to those embodiments. For example, the process tube 203 as the reaction tube may also be a single-tube.

Although the case of forming the nitride film on the surface of each wafer 200 by supplying high-temperature NO gas (or, mixed gas of $N_2O$ gas and NO gas) into the process chamber 201 has been described in the above-described embodiments, the present invention is not limited to those embodiments. For example, the present invention can also be very suitably applied to a case of forming an oxide film such as BIO, $SiO_2$ or HTO on the surface of each wafer 200 by supplying oxygen (O) containing gas into the process chamber 201. Moreover, the present invention can also be very suitably applied to a case of forming films other than the nitride film or the oxide film.

<Complementary Note>

Hereinafter, the preferred embodiments of the present invention will be complementarily described.

In accordance with one aspect of the present invention, there is provided a substrate processing apparatus, comprising: a process chamber configured to accommodate a substrate; a gas supply line configured to supply gas into the process chamber; and an exhaust line configured to exhaust the inside of the process chamber, wherein the gas supply line comprises: a preheating unit configured to preheat the gas before supplying the gas into the process chamber; a metal pipeline configured to supply the preheated gas into the process chamber; and a heat dissipation member covering the outer periphery of a bent section formed in the metal pipeline.

Preferably, the heat dissipation member comprises a pair of metal members between which the outer periphery of the bent section formed in the metal pipeline is intervened by a clamp.

Preferably, the facing surfaces of the pair of the metal members are recessed in the same shape as the bent section in order to increase the contact area between the outer periphery of the bent section and the metal members.

Preferably, at the pair of the metal members, a groove structure is formed to increase the surface area of the pair of the metal members.

Preferably, the gas supply line comprises: a quartz pipeline configured to exhaust the preheated gas out of the preheating unit; and a joint part configured to connect a downstream end of the quartz pipeline to an upstream end of the metal pipeline.

Preferably, the joint part comprises: a first flange installed in the downstream end of the quartz pipeline; and a second flange installed in the upstream end of the metal pipeline, wherein the first flange and the second flange are jointed through a sealing member to face each other, so that the downstream end of the quartz pipeline and the upstream end of the metal pipeline are air-tightly connected together.

Preferably, the inner diameter of the sealing member is greater than the inner diameter of the quartz pipeline and the inner diameter of the metal pipeline, so that high-temperature gas flowing from the quartz pipeline to the metal pipeline does not directly contact the sealing member.

Preferably, at the inside of the second flange, a cooling medium flow channel is formed so that cooling liquid or cooling gas is circulated.

Preferably, the gas supply line comprises a cooling medium exhaust pipe configured to exhaust the cooling liquid or cooling gas from the cooling medium flow channel, and the cooling medium exhaust pipe contacts the heat dissipation member so that heat is transferred to the heat dissipation member.

Preferably, the gas supply line comprises a cooling medium supply pipe configured to supply the cooling liquid or cooling gas into the cooling medium flow channel, and the cooling medium supply pipe contacts the heat dissipation member so that heat is transferred to the heat dissipation member.

Preferably, the cooling medium exhaust pipe is intervened between the pair of the metal members, together with the metal member.

Preferably, a bent section is installed near the downstream end of the quartz pipeline.

What is claimed is:

1. A substrate processing apparatus, comprising:
a process chamber configured to accommodate a substrate;
a gas supply line configured to supply a gas to an inside of the process chamber; and
an exhaust line configured to exhaust the inside of the process chamber,
wherein the gas supply line comprises:
a preheating unit preheating the gas supplied from a gas source,
a metal pipeline having an angled section, the metal pipe line connecting the preheating unit and the inside of the process chamber to supply the gas preheated by the preheating unit into the process chamber, and
a heat dissipation member covering the angled section to dissipate heat from the angled section,
the heat dissipation member comprising a pair of metal members facing each other to cover an outer surface of the angled section and a clamping means to fasten the pair of metal members to each other.

2. The apparatus of claim 1, wherein each of facing surfaces of the pair of metal members includes a recess having a same shape as that of the angled section such that the angled section is disposed within the recess.

3. A substrate processing apparatus, comprising:
a process chamber configured to accommodate a substrate;
a gas supply line configured to supply a gas to an inside of the process chamber; and
an exhaust line configured to exhaust the inside of the process chamber,
wherein the gas supply line comprises:
a preheating unit preheating the gas supplied from a gas source,
a metal pipeline having an angled section, the metal pipe line connecting the preheating unit and the inside of the process chamber to supply the gas preheated by the preheating unit into the process chamber,
a heat dissipation member covering the angled section to dissipate heat from the angled section, a quartz pipeline having an upstream end connected to the preheating unit, and a joint disposed between a downstream end of the quartz pipeline and an upstream end of the metal pipeline.

4. The apparatus of claim 3, wherein the joint comprises:

a first flange connected to the downstream end of the quartz pipeline; a second flange connected to the upstream end of the metal pipeline; and a sealing member disposed between the first flange and the second flange.

5. The apparatus of claim 4, wherein the second flange comprises:

a cooling medium flow channel connected between a cooling medium supply pipe; and a cooling medium exhaust pipe to circulate a cooling medium within the second flange.

6. The apparatus of claim 5, wherein one of the cooling medium supply pipe and the cooling medium exhaust pipe is in thermal contact with the heat dissipation member.

* * * * *